(12) United States Patent  (10) Patent No.: US 7,219,803 B2
Thomas, Jr. et al.  (45) Date of Patent: May 22, 2007

(54) CARRIER TAPE FOR DISK COMPONENTS (75) Inventors: Ronald E. Thomas, Jr., Mt Baldy, CA (US); Steven P. Kolbow, Chaska, MN (US); Joy A. Duban-Hu, Greenfield, MN (US)

(73) Assignee: Entegris, Inc., Chaska, MN (US)

( * ) Notice: Subject to any disclaimer, the term of this patent is extended or adjusted under 35 U.S.C. 154(b) by 36 days.

(21) Appl. No.: 11/091,697

(22) Filed: Mar. 28, 2005

(65) Prior Publication Data
US 2006/0213805 A1 Sep. 28, 2006

(51) Int. Cl.
B65D 85/00 (2006.01)

(52) U.S. Cl. .................. 206/714; 206/710; 206/820

(58) Field of Classification Search ............. 206/710, 206/713–714, 717, 390, 445, 486–490, 820
See application file for complete search history.

(56) References Cited

U.S. PATENT DOCUMENTS

| | | | |
|---|---|---|---|
| 2,281,237 A * | 4/1942 | Eckman ................... 206/445 |
| 3,095,677 A * | 7/1963 | Dreyfus et al. ............ 206/445 |
| 4,084,690 A | 4/1978 | Pulse |
| 4,354,337 A | 10/1982 | Mori et al. |
| 4,867,308 A * | 9/1989 | Crawford et al. .......... 206/714 |
| 5,115,911 A * | 5/1992 | Schulte et al. ............. 206/714 |
| 5,119,934 A | 6/1992 | Karasawa et al. |
| 5,234,104 A * | 8/1993 | Schulte et al. ............. 206/714 |
| 5,515,968 A | 5/1996 | Taniyama |
| 5,769,236 A * | 6/1998 | Maruyama et al. ......... 206/714 |
| 5,788,068 A | 8/1998 | Fraser et al. |
| 5,810,170 A | 9/1998 | Alvité |
| 6,415,918 B1 | 7/2002 | Wong et al. |
| 6,502,694 B1 | 1/2003 | Pijanowski et al. |
| 6,698,586 B2 | 3/2004 | Sankey et al. |
| 2003/0019771 A1 | 1/2003 | Iandoli et al. |
| 2004/0031707 A1 | 2/2004 | Pettigrew et al. |
| 2004/0206665 A1* | 10/2004 | Lang ......................... 206/713 |

FOREIGN PATENT DOCUMENTS

EP 0896719 B1 7/2002

* cited by examiner

Primary Examiner—Bryon P. Gehman
(74) Attorney, Agent, or Firm—Patterson, Thuente, Skaar Christensen, P.A.

(57) ABSTRACT

A carrier tape for holding a plurality of disks includes a thin, elongate strip of polymer material presenting a longitudinal axis and having a plurality of pockets defined therein. Each pocket is adapted to receive a separate one of the disks. The pockets are spaced apart and arranged along the longitudinal axis of the strip, and each pocket has at least one operable disk restraining structure for retaining the disk when the disk is received in the pocket.

36 Claims, 9 Drawing Sheets

CARRIER TAPE FOR DISK COMPONENTS

FIELD OF THE INVENTION

The present invention relates to the storage and transport of electrical components, and more specifically, to a carrier tape for the storage and transport of components for use in data storage drives.

BACKGROUND OF THE INVENTION

"Carrier tapes," also known as tape and reel carriers, have found extensive use in the transport and storage of electronic components. Many carrier tape systems are formed from a base strip that is embossed with a plurality of pockets dimensioned to accommodate a particular electronic component. After the component is loaded, the pockets are sealed, typically with a separate cover tape. Some carrier systems utilize hinged flaps integral to the base strip and disposed laterally relative to each embossed pocket. Systems of this sort require a tape that is initially of double width in order to provide material for the flap. Moreover, closure of the flap sometimes requires remolding of the hinge zone. Other carrier tape systems utilize lids that are secured in place by engagement of protrusions on the side of the lid that fit into dimpled recesses at the perimeter of the opening of the embossed pocket. The lids are not formed from material integral to the base strip, but rather are a separate, detachable component.

Disks in the form of semiconductor wafers have previously been stored in individual compartments then taped together with an adhesive strip. Embossed carrier tapes, however, have not generally been used for this purpose. One problem with the storage of rigid magnetic or semiconductor disks in a carrier tape is the difficulty of providing effective means for securing the disk in place. Components stored in embossed carrier tapes are typically supported from the bottom or about the perimeter of the component. The surfaces of a magnetic or semiconductor disk are valuable and sensitive to contact. Contact between the tape and these portions may result in damage and loss of inventory during shipping and handling.

Another concern, relating particularly to the use of an embossed carrier tape for data storage drive components such as disks, has to do with dust contamination. Previous carrier tapes that have a reusable closure typically do not provide a hermetic seal, making them relatively prone to dust contamination.

What is needed in the industry is an embossed carrier tape suitable for holding components for data storage drives such as magnetic and semiconductor disks.

SUMMARY OF THE INVENTION

The present invention addresses the need of the industry for an embossed carrier tape suitable for holding components for data storage drives such as magnetic and semiconductor disks. According to the invention, a carrier tape for holding a plurality of disks includes a thin, elongate strip of polymer material presenting a longitudinal axis and having a plurality of pockets defined therein. Each pocket is adapted to receive a separate one of the components. The pockets are spaced apart and arranged along the longitudinal axis of the strip, with each disk retaining pocket having operable means for retaining a disk when the disk is received in the pocket.

In some embodiments, the carrier tape includes a plurality of closure flaps, wherein each closure flap is for closing a separate one of the pockets and is selectively shiftable between an open position wherein the closure flap is substantially coplanar with the strip and a closed position wherein the closure flap is covering the pocket. In these embodiments, the means for retaining the disk when the disk is received in the pocket may include corresponding disk retaining structures on the closure flap and the bottom of the pocket. These disk retaining structures may be a recess in the bottom of the pocket and a projection on the closure flap or a projection on the bottom of the pocket and a mating protrusion on the closure flap. The strip may have a sealing channel surrounding each pocket and the closure flap may have a corresponding sealing rib engagable in the sealing channel to seal the pocket when the closure flap is disposed in the closed position.

In other embodiments, the means for retaining the disk when the disk is received in the pocket may include at least one resilient disk retaining structure in the pocket. The at least one resilient disk retaining structure is positioned so that when the disk is received in the pocket, the disk retaining structure applies a biasing force to the disk to retain the disk in the pocket. The disk retaining structure is selectively deflectable so as to enable the disk to be removed and inserted from the pocket. In some embodiments wherein the disks have a center aperture, the at least one disk retaining structure includes a bifurcated hub that engages in the center aperture of the disk. The bifurcated hub may include at least one locking protrusion extending radially therefrom. In other embodiments, the at least one disk retaining structure may include a plurality of resilient fingers, the fingers positioned to engage the periphery of the disk.

An object and advantage of the invention is that it provides a reusable compartment for the storage of rigid magnetic and semiconductor disks in carrier tape form. The flap can be opened and reset without the use of special tooling, thereby providing a readily reusable storage container in tape-and-reel form. In one embodiment, the rib-and-channel dust resistant barrier helps protect the disk from contamination without resort to an adhesive cover tape.

Another advantage of certain embodiments is that a lead-in structure shrouds the free end of the closure flap. The lead-in helps prevent the closure flap from being inadvertently opened during handling.

Another advantage of certain embodiments is that the invention can secure and suspend a disk on a nub or disk keeper that engages the center hole of the disk, preventing the disk from rattling loosely within the pocket. Contact between the disk and the embossed pocket is thereby limited to surfaces having a higher acceptable tolerance for damage in the vicinity of the center hole of the disk.

The invention can also be implemented to secure components that do not have center holes. The active components of the bifurcated hub can be reconfigured to act as individual fingers that retain a component about discrete points on the component perimeter. The inventive concept can also be configured to provide an elongate structure that provides line contact to secure the edge of a component.

Other advantages are realized in the fabrication of the invention. The hinged cover flap configuration negates the need for a separate cover tape. Because the cover flap is formed from material along the longitudinal axis of the base tape, the invention can be formed from a single width base tape. The embodiments presented readily lend themselves to fabrication by an embossing technique.

DETAILED DESCRIPTION OF THE PREFERRED EMBODIMENTS

Figure 1:
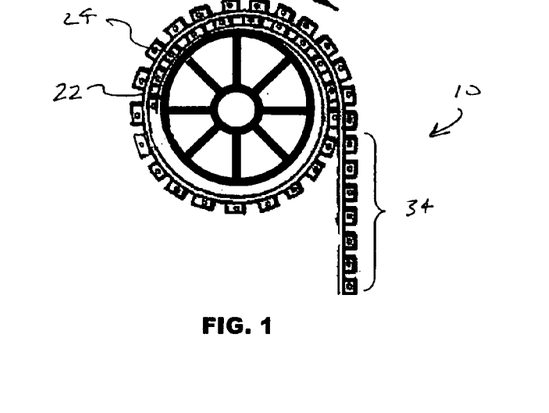
FIG. 1 is a side elevation view of a tape and reel configuration for the carrier tape of the invention.

Referring to FIG. 1, a tape and reel carrier 20 of the present invention is depicted. Tape and reel carrier 20 includes carrier tape 22 wound around reel 24. Carrier tape 22 is typically made in industry standard widths from 8-mm to 200-mm. Although any suitable diameter may be used, reel 24 is typically 22-in. diameter (industry standard), with diameters of 13-in and 30-in. also commonly available.

Carrier tape 22 may be formed by a process of injection molding, embossing or by any other molding means known in the art. The process of embossing typically involves the deformation of an initially flat polymeric strip using a tool to achieve the desired form (e.g., male and female die sets, or a male or a female die over which the strip is vacuum formed). Embossing may also involve a thermoforming process, wherein a thermoplastic sheet or strip is heated prior to the deformation. Suitable embossing techniques are disclosed in U.S. Pat. Nos. 5,132,160 and 6,003,676, which are both hereby fully incorporated by reference.

Figure 2:
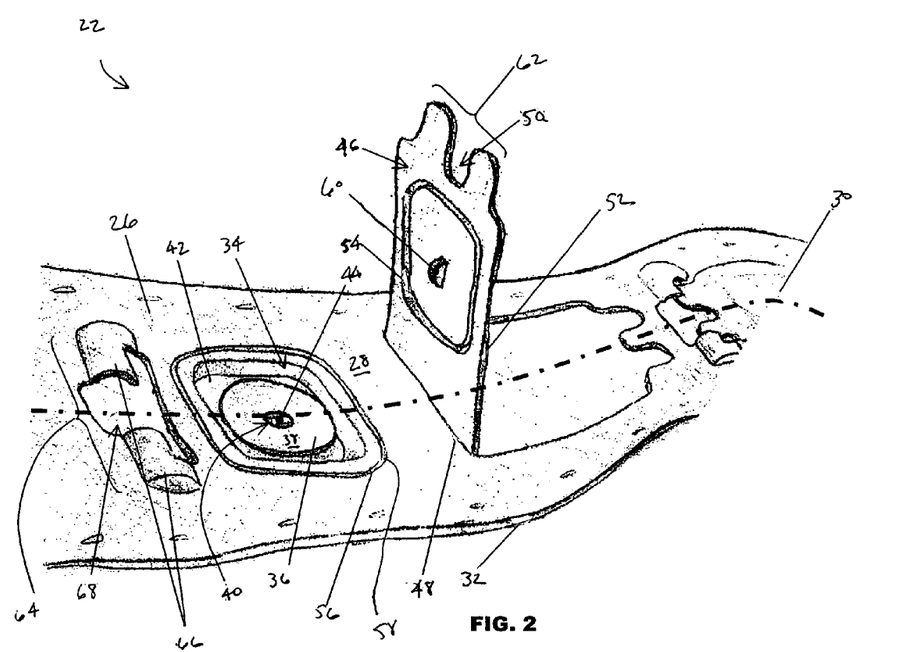
FIG. 2 is a perspective view of a portion of an embodiment of a carrier tape according to the invention.

Referring to FIG. 2, a closer view of an embodiment of a carrier tape according to the invention is depicted. Carrier tape 22 generally includes a base strip 26 formed from thin, flexible polymer material and having an upper surface 28, a longitudinal axis 30 and elongate side edges 32 that run the length of the base strip. A plurality of pockets 34 are spaced apart on base strip 26 along longitudinal axis 30. In the depicted embodiment, each pocket 34 is dimensioned and shaped to receive a single disk 36 that has an upper surface 38 and a center hole 40. Pocket 34 has a bottom 42 in which a recess 44 is defined. Disk 36 is positioned so that center hole 40 is substantially axially aligned with recess 44. Carrier tape 22 may further include cover or closure flap 46 having a hinged end 48, a free end 50, and a peripheral portion 52. The various embodiments disclosed generally anticipate disk diameters on the order of 27-mm and smaller, although it will be appreciated that the invention may be used with a disk of any size capable of storage within a practical width of a carrier tape.

In the FIG. 2 embodiment, peripheral portion 52 of cover flap 46 is cut, punched or otherwise formed from base strip 26 immediately adjacent pocket 34 and disposed along longitudinal axis 30 between pocket 34 and the next adjacent pocket. Continuous protruding rib 54 projects from cover flap 46 and mates with corresponding channel 56 in the base strip. Channel 56 encircles pocket 34 so that when protruding rib 54 is mated with channel 56, a dust resistant barrier 58 is formed to seal pocket 34 against intrusion of dust or other contaminants. Protrusion 60 extends from cover flap 46 to mate with corresponding recess 44 in bottom 42 of pocket 34. Protrusion 60 functions to center disk 36 in pocket 34 when closure flap 46 is positioned in a closed position over pocket 34. Protrusion 60 and corresponding recess 44 may be dimensioned so that protrusion 60 is retained in recess 44 by friction to retain cover 46 in the closed position.

The cover flap of FIG. 2 may further include a pair of cover flap tabs 62 that extend in a longitudinal direction from free end 50. Tabs 62 work in conjunction with lead-in structure 64 to inhibit accidental opening of cover flap 46 during shipping and handling of carrier tape 22. Lead-in structure 64 generally includes raised portion 66 extending upward from upper surface 28 of base strip 26. Cut away portion 68 of raised portion 66 functions to capture tabs 62 when cover flap 46 is in the closed position. When cover flap 46 is in the closed position, tabs 62 are engaged in lead-in 64 through cutaway portion 68 and snap into place beneath raised portion 66. To release cover flap 46 from lead-in structure 64, tabs 62 may be deflected laterally toward each other, causing tabs 62 to slip out from under raised portion 66, thereby freeing tabs 62 from lead-in structure 64.

Figure 3:
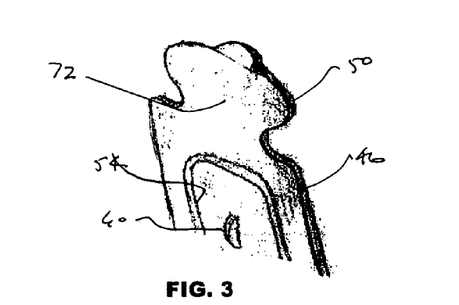
FIG. 3 is a perspective view of the closure flap of an embodiment of a carrier tape according to the invention.

Referring now to FIG. 3, an embodiment of cover flap 46 is depicted with a single tab 72. Single tab 72 snaps into lead-in structure 64 in the same manner as for dual tabs 62 of the embodiment of FIG. 2. Single tab 72, however, is pried upward and out of lead-in structure 64 during release of cover flap 46.

Figure 4A:
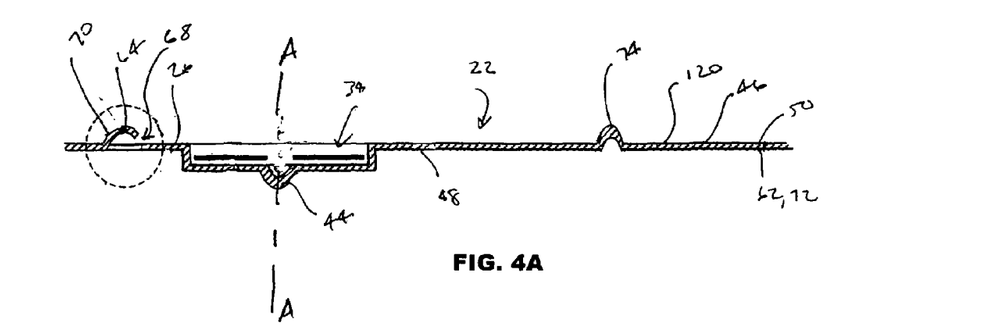
FIG. 4A is a cross-sectional view of an embodiment of the invention with the closure flap in the open position.
Figure 4B:
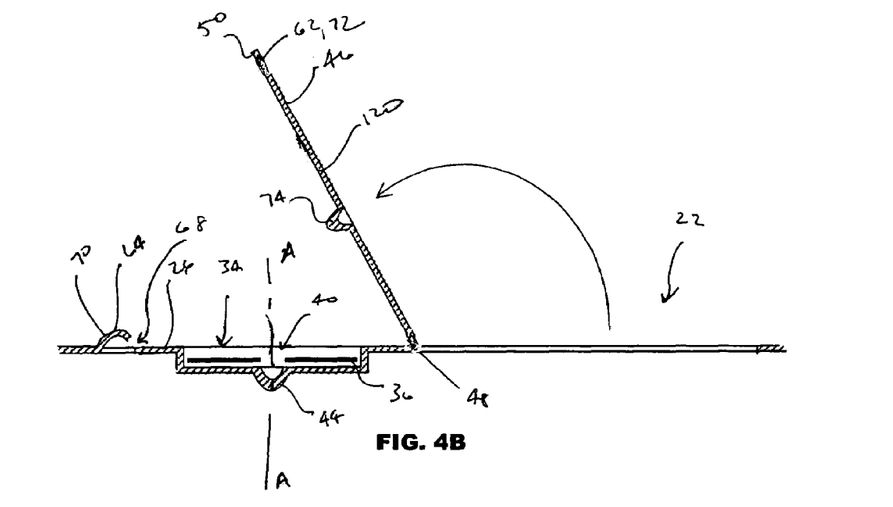
FIG. 4B is a cross-sectional view of the embodiment of FIG. 4A with the closure flap in an intermediate position.
Figure 4C:
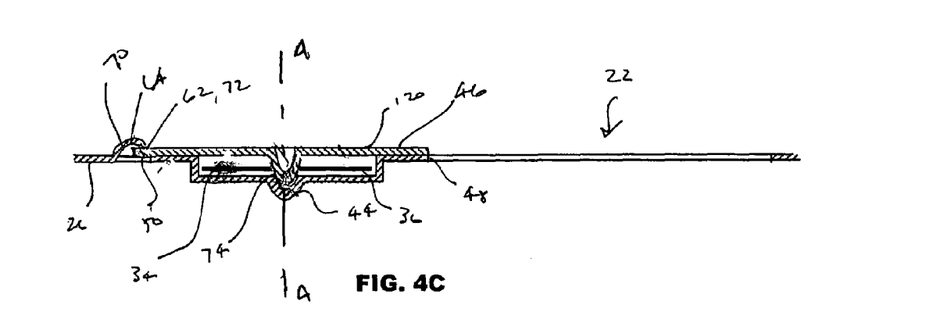
FIG. 4C is a cross-sectional view of the embodiment of FIG. 4A with the closure flap in the closed position.
Figure 5A:
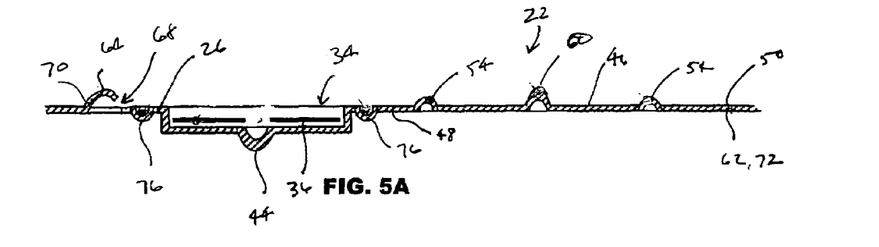
FIG. 5A is a cross-sectional view of another embodiment of the invention with the closure flap in the open position.
Figure 5B:
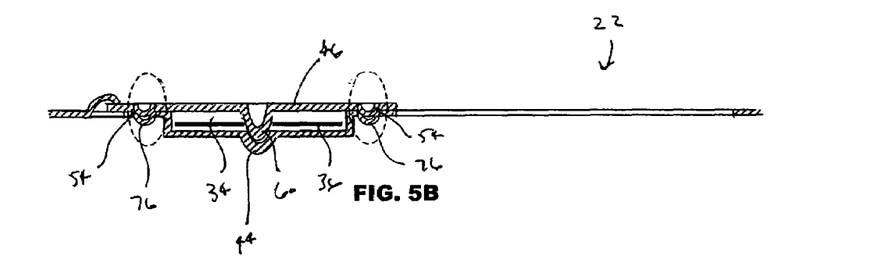
FIG. 5B is a cross-sectional view of the embodiment of FIG. 5A with the closure flap in the closed position.
Figure 6A:
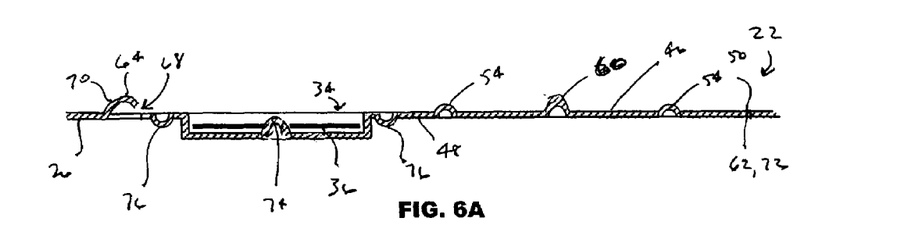
FIG. 6A is a cross-sectional view of yet another embodiment of the invention with the closure flap in the open position.
Figure 6B:
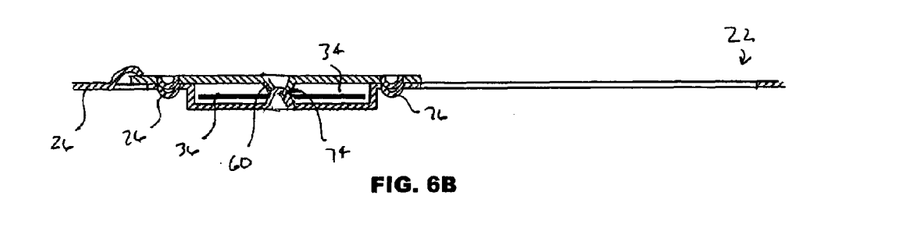
FIG. 6B is a cross-sectional view of the embodiment of FIG. 6A with the closure flap in the closed position.

FIGS. 4–6 depict cross sectional views of various embodiments of the present invention. FIG. 4A depicts an embodiment of carrier tape 22 with closure flap 46 positioned in a closed position wherein closure flap 46 is substantially coplanar with base strip 26. Nub or disk keeper 74 projects from closure flap 46 and is positioned so as to mate with recess 44 to secure closure flap 46 when closure flap 46 is positioned in the closed position as depicted in FIG. 4C. Closure flap 46 is coupled with strip 26 at hinge 48. Hinge 48 is oriented along an axis generally perpendicular to the longitudinal axis of strip 26. Lead-in structure 64 generally includes raised portion 70 with cut away portion 68. As depicted in FIG. 4C, tabs 62 or tab 72 are captured by lead-in structure 64 when closure flap 46 is positioned in the closed position, thereby inhibiting any snagging tendency of free end 50 and inadvertent opening of closure flap 46 during shipping or handling.

In operation, disk 36 is positioned so that center aperture 40 is aligned with recess 44 along the center axis of aperture 40 and recess 44, designated in the figures as axis A—A. As depicted in FIG. 4B, closure flap 46 may be pivoted about hinge 48 towards the closed position. Once in the closed position as depicted in FIG. 4C, closure flap 46 is positioned over pocket 34 and disk keeper 74 extends downward through center aperture 40 of disk 36, thereby securing disk 36 within pocket 34.

An alternative embodiment of the invention is depicted in FIGS. 5A and 5B. In this embodiment, channel 76 is defined in strip 26 surrounding pocket 34 and is mirrored by continuous protruding rib 54 on closure flap 46. As depicted in FIG. 5B, when closure flap 46 is positioned in the closed position, protruding rib 54 mates with channel 76 to form a dust resistant barrier that encircles and seals pocket 34 against particulates and other contaminants. The remaining structure and operation of the embodiment of FIGS. 5A and 5B is otherwise generally as described for the FIG. 4A–C embodiment as described above.

Another alternative embodiment of the invention is depicted in FIGS. 6A and 6B. In this embodiment, nub 74 projects upwardly from bottom 42 of pocket 34. A corresponding closure flap protrusion 60 is positioned on closure flap 46. When closure flap 46 is positioned in the closed position as depicted in FIG. 6B, a closure is formed and secured by the mating of protrusion 60 with nub 74. In the depicted embodiment, nub 74 is located on the bottom of pocket 34 and extends upward through center hole 40 of disk 36.

Figure 7:
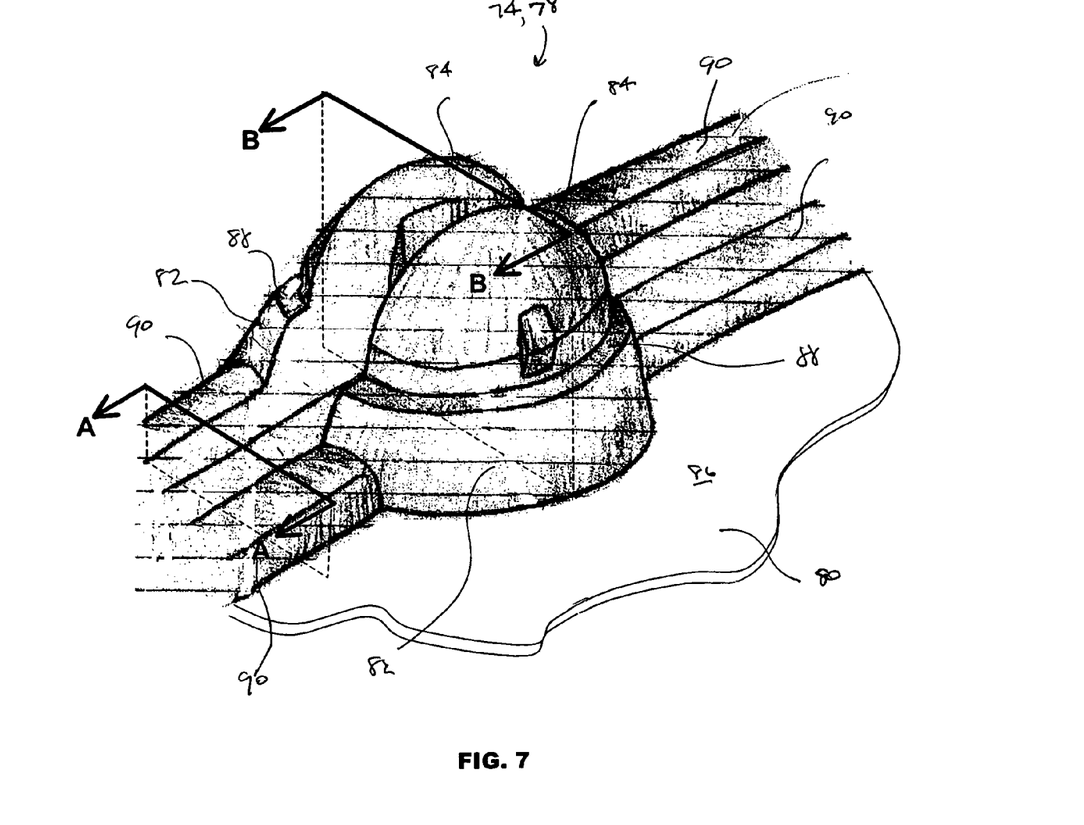
FIG. 7 depicts an embodiment of a bifurcated hub disk keeper according to the invention.

Referring to FIG. 7, disk keeper 74 is configured as a bifurcated hub 78. Bifurcated hub 78 generally includes base portion 80, pedestal portions 82 and side portions 84. Base portion 80 has upper surface 86. The pedestal portions 82 project upwardly from upper surface 86, and each have upper registration surface 88 that faces substantially upward, upon which disk 36 is seated when received on bifurcated hub 78. Side portions 84 extend upward from pedestal portion 82. Elongate ribs 90 also protrude upward from upper surface 86 of base portion 80.

Figures 8A, 8B, 8C:
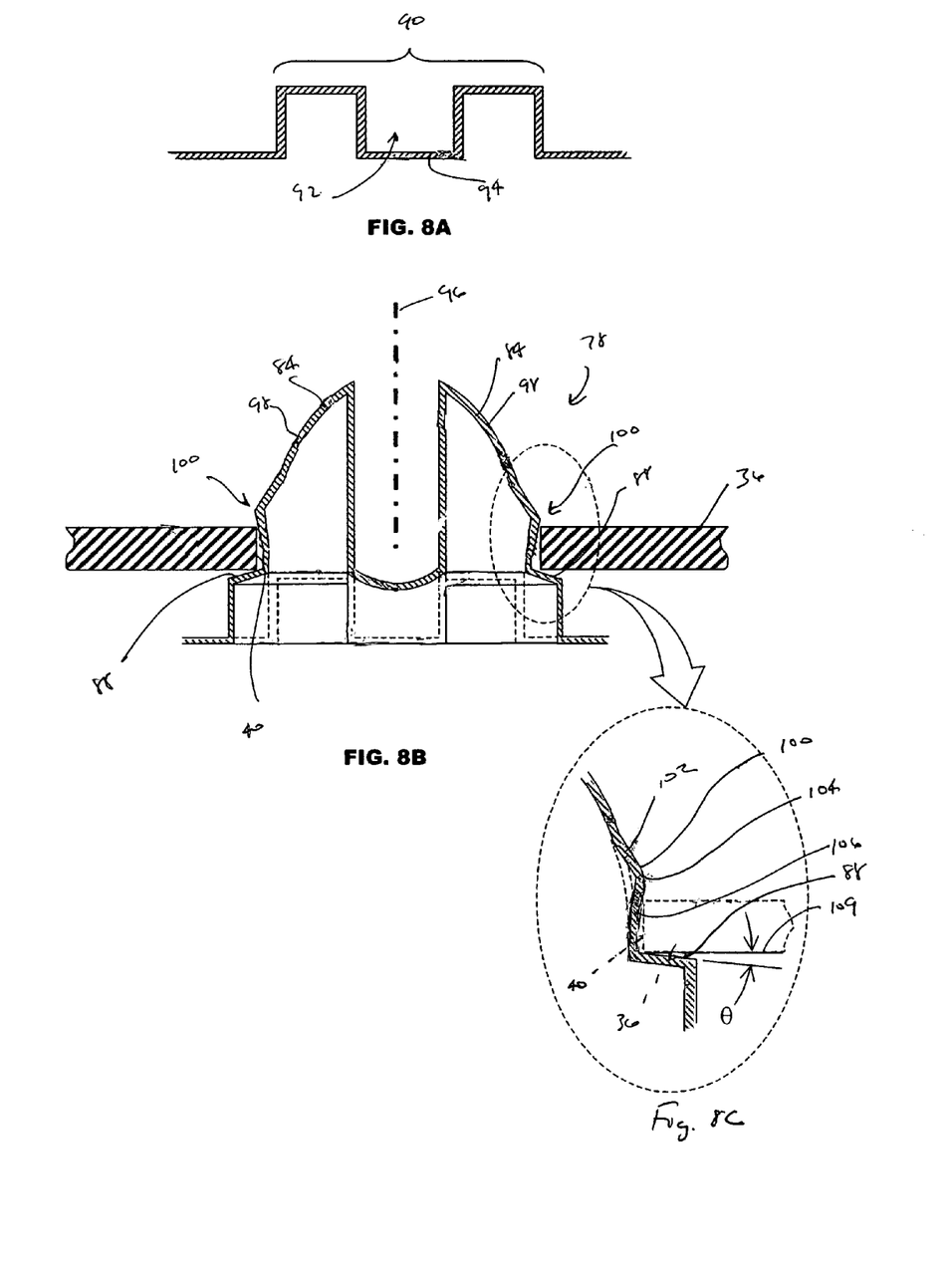
FIG. 8A depicts a portion of a disk keeper embodiment in cross-section.
FIG. 8B is a partial cross-sectional view of a bifurcated hub disk keeper according to the invention.
FIG. 8C is an enlarged view of a portion of the bifurcated hub of FIG. 8B.

Referring to FIG. 8A, ribs 90 are depicted in cross-sectional view from section A—A of FIG. 7. Ribs 90 are separated by gap 92 and may be connected by web portion 94.

In FIG. 8B, bifurcated hub 78 is depicted in cross sectional view from section B—B of FIG. 7. As depicted, side portions 84 are disposed radially outward from and on either side of center axis 96. Each side portion 84 has an outer surface 98 facing away from center axis 96. Each side portion 84 may also have one or more locking protrusions 100 that extend radially outward from outer surface 98 of side portion 84. Locking protrusions 100, as depicted in FIG. 8C, generally include tapered leading edge portion 102, crown portion 104 and trailing edge portion 106. Leading edge 102 is dimensioned to slideably engage the inner diameter of center hole 40 as disk 36 slides over locking protrusions 100.

In operation, disk 36 is positioned above bifurcated hub 78 such that center hole 40 of disk 36 is aligned with center axis 96. The disk is then pressed downward upon bifurcated hub 78 deflecting side portions 84 inwardly as the inner edge of center hole 40 slides over locking protrusions 100. As disk 36 slides over crown portion 104 and onto trailing edge portion 106, side portions 84 resiliently return toward their original position. When disk 36 is fully engaged on bifurcated hub 78, side portions 84 extend through center hole 40 and disk 36 is engaged with upper registration surface 108. Crown portion 104 extends partially over upper surface 38 near center hole 40 of disk 36. Trailing edge portion 106 is engaged with disk 36 and exerts a biasing force directed generally downward and outward on disk 36 so as to firmly seat disk 36 on upper registration surface 88. As depicted, contact with locking protrusion 100 remains limited to a line of contact along the upper corner of center hole 40. In this way, locking protrusions 100 of the various embodiments serve to secure disk 36 in place when bifurcated hub 78 extends through center hole 40 of disk 36.

FIG. 8C also depicts upper registration surface 88 as having a slope θ with respect to a plane 109 defined generally orthogonal to center axis 96. It is generally preferred that slope θ be some value other than zero, so that upper registration surface 88 slopes downward and away from side portion 84, thereby maintaining line contact between upper registration surface 108 and the inner diameter of center hole 40 and minimizing the area of contact. Hence, contact with hard disk 36 (shown in phantom) is limited to line contact along the upper and lower corners of center hole 40.

Figure 9:
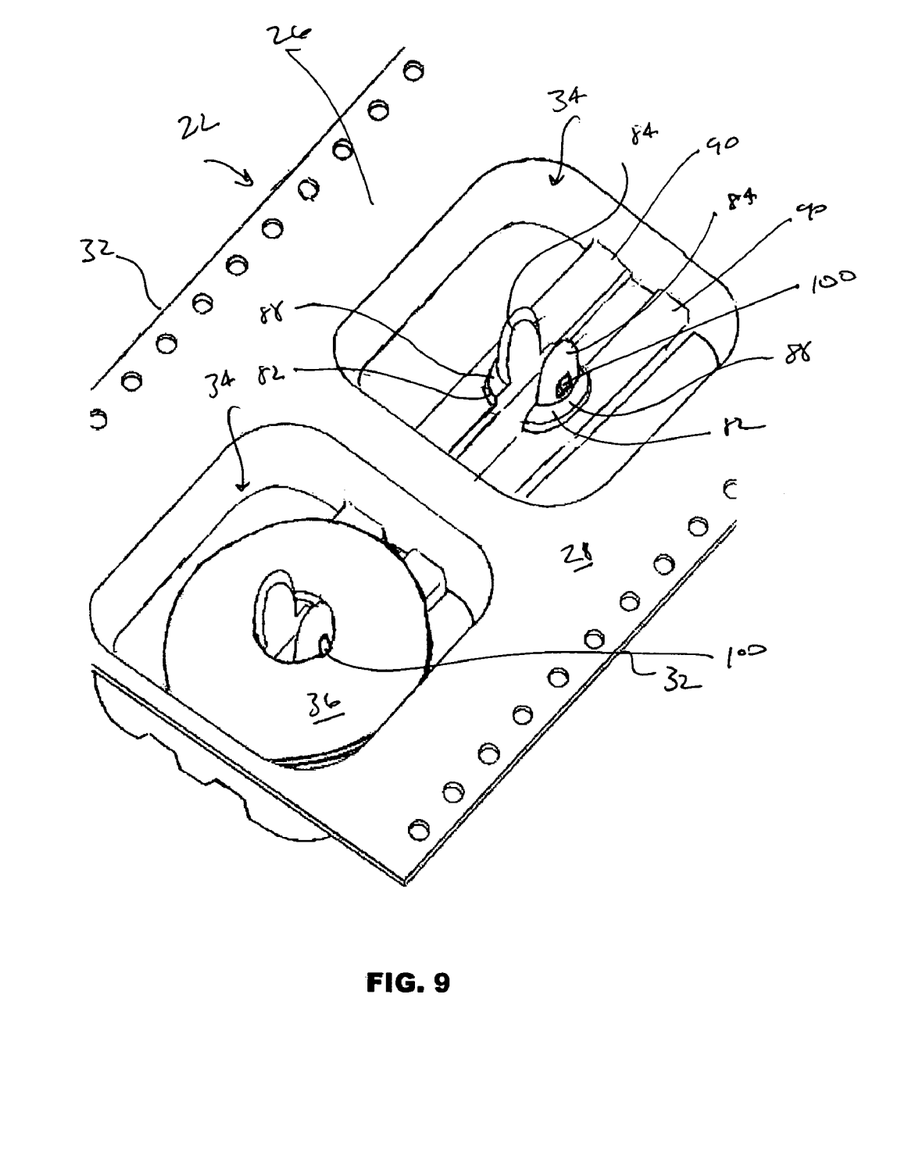
FIG. 9 is a perspective view of a carrier tape with a bifurcated hub disk keeper according to the invention.

Referring to FIG. 9, bifurcated hub 78 is depicted positioned in pocket 34 of carrier tape 22. Tape 22 may be utilized in conjunction with a separate cover tape (not shown) for protection or containment of disk 36 or both as is well known in the art. In such embodiments, the cover tape may be glued or otherwise adhered to upper surface 28 of base strip 26, so as to hermetically seal pocket 34. It will be appreciated that other fastening methods, such as a mechanical coupling to base strip 26 by a friction or interference fit with plurality of pockets 34, or by a tongue-and-groove arrangement on upper surface 28 that runs along elongate side edges 32, may also be used and are contemplated within the scope of the present invention. It will also be appreciated that a folding closure flap as described for the embodiments of FIGS. 4A through 6B may be incorporated in the embodiment of FIG. 9 within the scope of the present invention.

Figure 10:
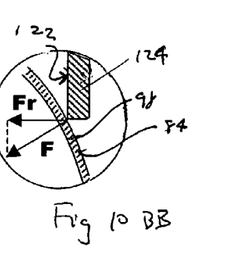
FIG. 10A depicts one disengaging means for a disk keeper according to the invention.
FIG. 10B illustrates an alternate disengaging means for a disk keeper according to the invention.
FIG. 10C depicts an alternate configuration of a disk keeper and disengaging means according to the invention.
FIG. 10D shows another alternate configuration of a disk keeper and means of releasing according to the invention.
Figure 10A:
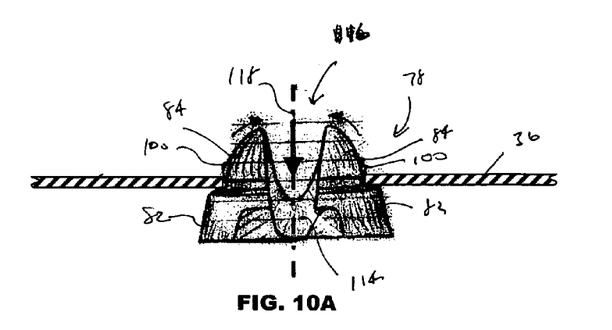

In FIG. 10A, bifurcated hub 78 is depicted in elevation view. The two side portions 84 are connected by a bridge 114 that spans gap 116. In operation, the side portions 84 are deflected in the direction of the arrows to release disk 36. A force 118 is exerted on bridge 114, causing side portions 84 to deflect inward. This inward deflection also causes locking protrusions 100 to retract inwards toward center axis 96. This inward deflection of protrusions 100 releases disk 36 from bifurcated hub 78.

Figure 10B:
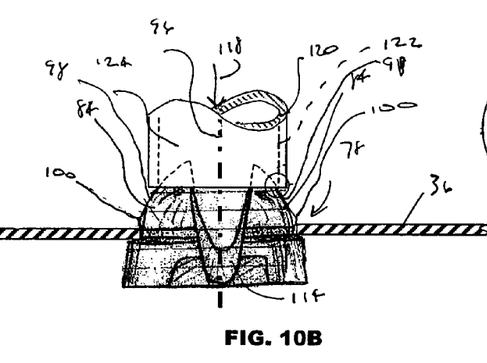

Referring to FIG. 10B, an alternate means of releasing disk 36 from bifurcated hub 78 is depicted. A release tool 120 with an interior surface 122 and an engagement end 124 is configured such that an engagement end 124 slideably engages outer surfaces 98 of side portions 84. Application of force 118 will exert a force denoted in the Figures as F on outer surface 98 that, because outer surfaces 98 of the FIG.

10B embodiment slope upwards and toward center axis 96, has a component denoted in the Figures as Fr that acts radially inward, thereby deflecting side portions 84 inward toward center axis 96. Because there is interaction with a sloping surface, engagement end 124 may be configured with interior surface 122 that is substantially parallel to center axis 96, such as a hollow cylinder. Utilization of release tool 120 or any other means that acts directly on side portions 84 enables the "bridgeless" bifurcated hub structure depicted.

Figure 10C:
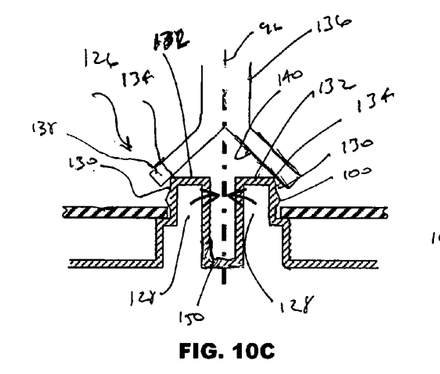

Referring now to FIG. 10C, another embodiment of a bifurcated hub 126 is depicted in cross-section. Each side portion 128 has an outer surface 130 that is substantially parallel to center axis 96 and an upper portion 132 that is substantially normal to center axis 96. Upper portion 132 and outer surface 130 intersect to form a corner portion 134. Release tool 136 has an engagement end 138 that has an inclined interior surface 140. The slope of inclined interior surface 140 at the point or line of contact with corner portion 134 creates a force vector (not shown) having a component that acts radially inward toward center axis 96 (similar to the one shown in the FIG. 10B inset). The radial inward force causes side portions 128 to retract inward, releasing disk 36.

Figure 10D:
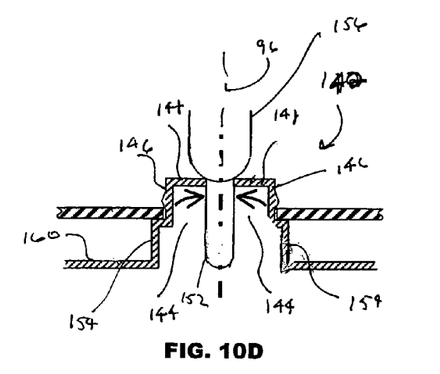

Referring to FIG. 10D, yet another embodiment of a bifurcated hub 142 is shown in cross-section. Like the bifurcated hub 126 of the FIG. 10C embodiment, bifurcated hub 142 has side portions 144 with outer surfaces 146 and upper portions 148 that are substantially parallel to and normal to center axis 96, respectively. However, unlike FIG. 10C, the FIG. 10D embodiment does not have a web portion 150 that connects the side portions. Bifurcated hub 142 instead has a slit 152 that runs the combined length of side portion 146 and pedestal portion 154. With this arrangement, engagement of an extraction tool 156 on upper portion 148 will cause side portions 144 to retract inward, thereby releasing disk 36. One way to affect the geometry of bifurcated hub 142 is to emboss pedestal portion 154, side portion 146 and upper portion 158 as a single, contiguous, axisymmetric protrusion that extends upward from a base 160. After the protrusion is formed, slit 152 is cut or otherwise formed to create the bifurcation.

It will be appreciated that, in the embodiments of FIGS. 10B–10D, release tools 120, 136 and 156 may take on a number of configurations to accommodate the shape of the bifurcated hub. Moreover, the hubs depicted in FIGS. 10A–10D are suitable for use with any substrate equipped with a center hole. It is further noted that actuation of the releasing means may be done either manually or by an automated process.

Figure 11:
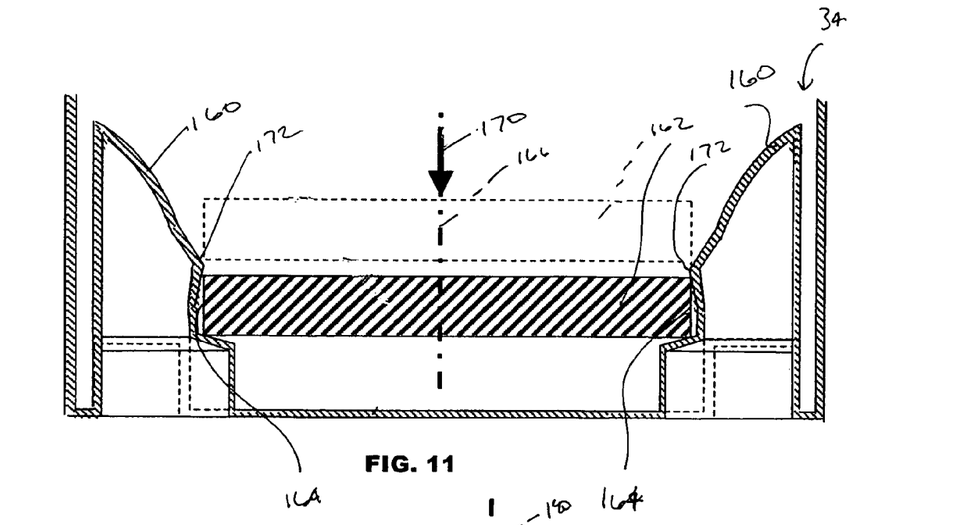
FIG. 11 is a cross-sectional view of the pocket of an alternative embodiment of a carrier tape according to the invention.

Other embodiments of the invention may be used to secure components that do not have center holes, such as semiconductor chips. In an embodiment, a resilient retention finger 160 grips a component 162 at a discrete point along its perimeter 164. Referring to FIG. 11, a component 162 is defined by a component axis 166 and a perimeter 168 of any shape. By forming a plurality of fingers 160 on the bottom of a pocket 34 in a configuration that outlines the perimeter, component 162 is secured by aligning its perimeter 164 with the fingers and exerting a downward force 170 on component 162, thereby pressing the component into place. As component 162 slides past locking protrusion 172, retention finger 160 deflects outward, away from component axis 166. Not only does this embodiment preclude the need for a through-hole on component 162, it can also secure components of any predetermined shape.

Figure 12:
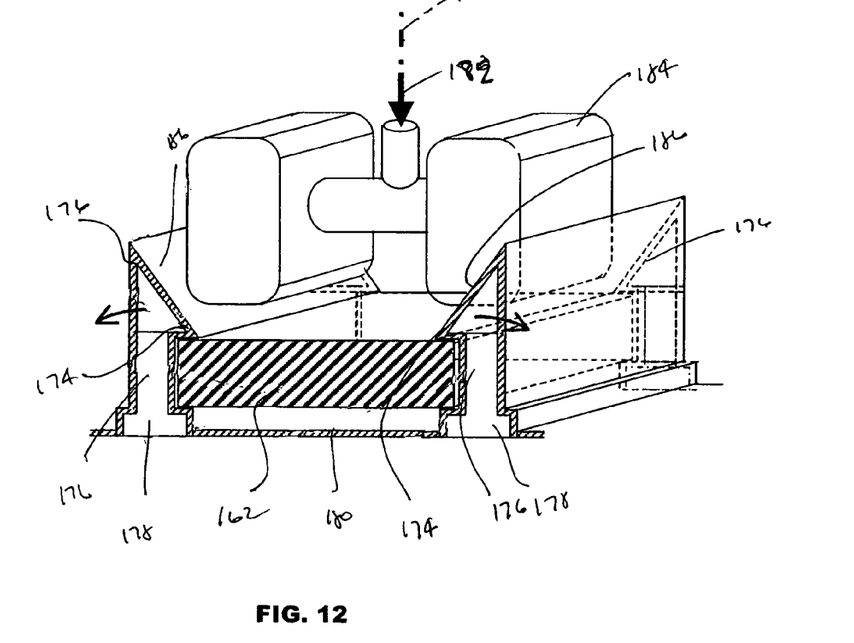
FIG. 12 is a perspective view of the pocket of another alternative embodiment of a carrier tape according to the invention.

In the embodiment of FIG. 12, an elongate structure provides line contact to secure the edge portion of a component, as opposed to the discrete point contact device of FIG. 11. The configuration has the same basic elements as the bifurcated hub of FIG. 8B. Locking protrusions 174 project from side portions 176 which extend upward from pedestal portions 178 that rise from a base portion 180, but are arranged in an elongate form. A downward force 182 exerted on release tool 184 causes engagement with inclined surfaces 186 to generate a force vector on side portions 176 that acts away from component axis 190. The deflection of side portions 176 thereby releases component 162.

Figure 13:
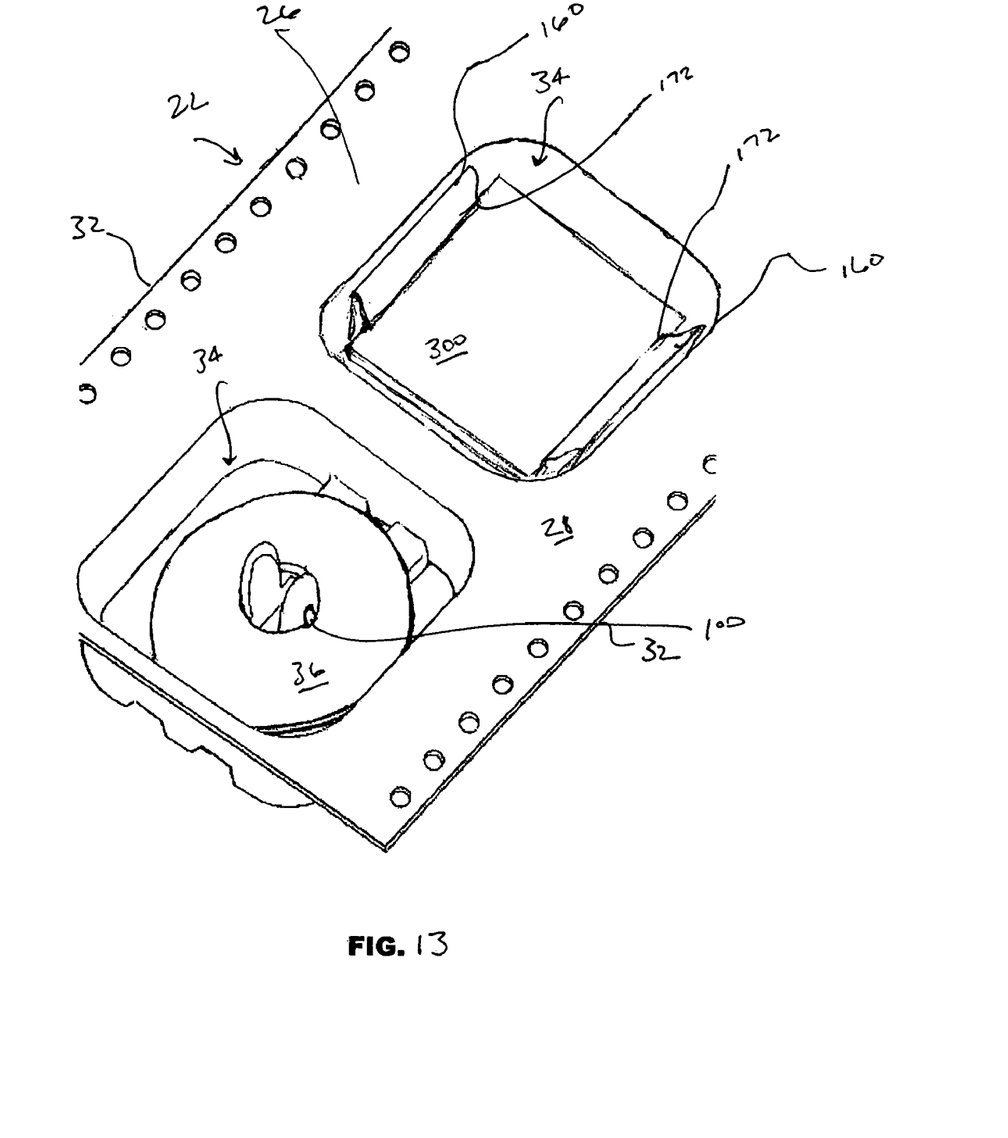
FIG. 13 is a perspective view of a carrier tape with pockets for carrying disparate components of an assembly seriatim with the same tape.

It will be readily appreciated that embodiments of the present invention may include pockets wherein data storage drive components other than disks are held in some pockets. Such embodiments may be useful where it is desired to load a series of components needed in assembly of the drive. In such embodiments, the tape may include a series of pockets, one or more of which may be a disk holding pocket as described herein above, and others of which may be pockets for holding semiconductor chips, drive heads, or other such components. Examples of carrier tapes with such pockets are disclosed in U.S. Pat. Nos. 4,702,370; 4,966,281; 5,152,393; 5,351,821 and 5,499,717 all of which are hereby fully incorporated herein by reference. For example, as depicted in FIG. 13, a carrier tape may have a series of pockets including a first pocket 34 for holding a semiconductor chip device 300, a second pocket 34 for holding a disk 36, and any number of other pockets (not depicted) for holding other components. The same series of pockets repeats seriatim for the entire length of the tape. Of course, it will be further appreciated that in other embodiments within the scope of the present invention, the series of pockets may include any number of pockets in the series, with any combination of pocket shapes and sizes.

The invention has been described above with reference to several embodiments thereof. It will be apparent to those skilled in the art that alterations may be made in the embodiments described without departing from the scope of the invention. Thus, the scope of the present invention should not be limited by the embodiments described herein, but rather by the language of the claims, and the equivalents of those structures.

What is claimed is:

1. The combination of a plurality of disks and a carrier tape for releasably holding the disks, the carrier tape comprising:
   a thin, elongate strip of polymer material presenting a longitudinal axis and having a plurality of pockets defined therein, each pocket for receiving an individual one of the plurality of disks, the plurality of pockets spaced apart and arranged along the longitudinal axis of the strip, each pocket having at least one resilient disk retaining structure therein, each resilient disk retaining structure being positioned so that when a disk is received in one of said pockets, its resilient disk retaining structure applies a biasing force to the disk to retain the disk in the pocket, said resilient disk retaining structure comprises one of a finger and a hub, said resilient disk retaining structure being selectively deflectable so as to enable the disk to be removed from and inserted into the pocket.

2. The combination of claim 1, wherein the carrier tape further comprises a plurality of closure flaps, each closure flap for closing a separate one of the pockets.

3. The combination of claim 2, wherein each closure flap is selectively shiftable between an open position wherein the closure flap is substantially coplanar with the strip and a closed position wherein the closure flap is covering the pocket.

4. The combination of a plurality of disks and a carrier tape for releasably holding the disks, the carrier tape comprising:
a thin, elongate strip of polymer material presenting a longitudinal axis and having a plurality of pockets defined therein, each pocket for receiving an individual one of the plurality of disks, the plurality of pockets spaced apart and arranged along the longitudinal axis of the strip, each pocket having at least one resilient disk retaining structure therein, each resilient disk retaining structure being positioned so that when a said disk is received in one of said pockets, its resilient disk structure applies a biasing force to the disk to retain the disk in the pocket, the resilient disk retaining structure being selectively deflectable so as to enable the disk to be removed from and inserted into the pocket, wherein each disk of the plurality of disks has a center aperture, and wherein each disk retaining structure engages in the center aperture of one of said disks.

5. The combination of claim 4, wherein each disk retaining structure comprises a bifurcated hub.

6. The combination of claim 5, wherein the pocket has a bottom surface and the bifurcated hub extends from the bottom surface into the pocket.

7. The combination of claim 6, wherein the bifurcated hub presents a center axis substantially normal to the bottom surface and comprises a pair of opposing pedestal portions separated by a gap, each of the pedestal portions having an upper registration surface facing substantially upward.

8. The combination of claim 7, wherein the bifurcated hub further comprises a pair of opposing side portions, each side portion extending upward from a separate one of the pedestal portions.

9. The combination of claim 5, wherein the bifurcated hub further comprises at least one locking protrusion extending radially therefrom.

10. The combination of claim 4, wherein each at least one disk retaining structure comprises a plurality of resilient fingers, the fingers positioned to engage the periphery of the disk.

11. A carrier tape for holding a plurality of disks, each disk having a center aperture formed therethrough, the carrier tape comprising:
a thin, elongate strip of polymer material presenting a longitudinal axis and having a plurality of pockets defined therein, each pocket having a bottom and adapted to receive an individual one of the plurality of disks, the plurality of pockets spaced apart and arranged along the longitudinal axis of the strip, the carrier tape further comprising a plurality of closure flaps, each closure flap for closing a separate one of the pockets and being selectively shiftable between an open position wherein the closure flap is substantially coplanar with the strip and a closed position wherein the closure flap is covering the pocket, the bottom of the pocket and the closure flap having corresponding disk retaining structures for retaining a disk when the disk is received in the pocket and the closure flap is positioned in the closed position, the corresponding disk retaining structures extending through an aperture of the disk.

12. The carder tape of claim 11, wherein the corresponding disk retaining structures comprise a recess in the bottom of the pocket and a projection on the closure flap.

13. The carrier tape of claim 11, wherein the corresponding disk retaining structures comprise a projection on the bottom of the pocket and a mating protrusion on the closure flap configured for securing said flap with said projection.

14. The carrier tape of claim 11, wherein the strip and the closure flap have corresponding structures for securing the closure flap in the closed position.

15. The carrier tape of claim 14, wherein the corresponding structures of the strip and closure flap for securing the closure flap in the closed position comprise a projection on the closure flap and a corresponding recess on the strip for receiving the projection on the closure flap.

16. A carrier tape for holding a plurality of disks, each disk having a center aperture formed therethrough, the carrier tape comprising:
a thin, elongate strip of polymer material presenting a longitudinal axis and having a plurality of pockets defined therein, each pocket having a bottom and adapted to receive an individual one of the plurality of disks, the plurality of pockets spaced apart and arranged along the longitudinal axis of the strip, the carrier tape further comprising a plurality of closure flaps, each closure flap for closing a separate one of the pockets and being selectively shiftable between an oven position wherein the closure flap is substantially coplanar with the strip and a closed position wherein the closure flap is covering the pocket, the bottom of the pocket and the closure flap having corresponding disk retaining structures for retaining a disk when the disk is received in the pocket and the closure flap is positioned in the closed position, wherein the closure flap folds along an axis substantially perpendicular to the longitudinal axis of the strip.

17. A carrier tape for holding a plurality of disks, each disk having a center aperture formed therethrough, the carrier tape comprising:
a thin, elongate strip of polymer material presenting a longitudinal axis and having a plurality of pockets defined therein, each pocket having a bottom and adapted to receive an individual one of the plurality of disks, the plurality of pockets spaced apart and arranged along the longitudinal axis of the strip, the carrier tape further comprising a plurality of closure flaps, each closure flap for closing a separate one of the pockets and being selectively shiftable between an oven position wherein the closure flap is substantially coplanar with the strip and a closed position wherein the closure flap is covering the pocket, the bottom of the pocket and the closure flap having corresponding disk retaining structures for retaining a disk when the disk is received in the pocket and the closure flap is positioned in the closed position, wherein the strip comprises a sealing channel surrounding each pocket and wherein the closure flap has a sealing rib engagable in the sealing channel to seal the pocket when the closure flap is disposed in the closed position.

18. A carrier tape for holding a plurality of disks, the tape comprising:
a thin, elongate strip of polymer material presenting a longitudinal axis and having a plurality of pockets defined therein, each pocket having a bottom and adapted to receive an individual one of the plurality of disks, the plurality of pockets spaced apart and arranged along the longitudinal axis of the strip, each pocket having an operable means for retaining a disk when the disk is received in the pocket, said operable means extending upwardly past a received disk and comprising one of a) a plurality of fingers that extend upwardly, and b) a hub.

19. The carrier tape of claim 18, wherein the carrier tape further comprises a plurality of closure flaps, each closure flap for closing a separate one of the pockets and being selectively shiftable between an open position wherein the closure flap is substantially coplanar with the strip and a closed position wherein the closure flap is covering the pocket.

20. The carrier tape of claim 19, wherein the means for retaining the disk when the disk is received in the pocket comprises corresponding disk retaining structures on the closure flap and the bottom of the pocket.

21. The carrier tape of claim 20, wherein the corresponding disk retaining structures comprise a recess in the bottom of the pocket and a projection on the closure flap.

22. The carrier tape of claim 20, wherein the corresponding disk retaining structures comprise a projection on the bottom of the pocket and a protrusion on the closure flap that mates with the projection.

23. The carrier tape of claim 20, wherein the strip and the closure flap have corresponding structures for securing the closure flap in the closed position.

24. The carrier tape of claim 23, wherein the corresponding structures of the strip and closure flap for securing the closure flap in the closed position comprise a projection on the closure flap and a corresponding recess on the strip for receiving the projection on the closure flap.

25. The carrier tape of claim 19, the means for retaining the disk when the disk is received in the pocket comprises at least one resilient disk retaining structure in the pocket, the at least one resilient disk retaining structure positioned so that when the disk is received in the pocket, the disk retaining structure applies a biasing force to the disk to retain the disk in the pocket, the disk retaining structure being selectively deflectable so as to enable the disk to be removed and inserted from the pocket.

26. A carrier tape for holding a plurality of disks, the tape comprising:
a thin, elongate strip of polymer material presenting a longitudinal axis and having a plurality of pockets defined therein, each pocket having a bottom and adapted to receive an individual one of the plurality of disks, the plurality of pockets spaced apart and arranged along the longitudinal axis of the strip, each pocket having an operable means for retaining a disk when the disk is received in the pocket wherein the closure flap folds along an axis substantially perpendicular to the longitudinal axis of the strip.

27. A carrier tape for holding a plurality of disks, the tape comprising:
a thin, elongate strip of polymer material presenting a longitudinal axis and having a plurality of pockets defined therein, each pocket having a bottom and adapted to receive an individual one of the plurality of disks, the plurality of pockets spaced apart and arranged along the longitudinal axis of the strip, each pocket having an operable means for retaining a disk when the disk is received in the pocket, wherein the strip comprises a sealing channel surrounding each pocket and wherein the closure flap has a sealing rib engagable in the sealing channel to seal the pocket when the closure flap is disposed in the closed position.

28. A thin, elongate strip of polymer material presenting a longitudinal axis and having a plurality of pockets defined therein, each of the plurality of pockets having a bottom and adapted to receive an individual one of a plurality of disks, the plurality of pockets spaced apart and arranged along the longitudinal axis of the strip, wherein each disk of the plurality of disks has a center aperture, and wherein each of the plurality of pockets having at least one disk retaining structure engageable in the center aperture of a disk.

29. The carrier tape of claim 28, wherein the at least one disk retaining structure comprises a bifurcated hub.

30. The carrier tape of claim 29, wherein the pocket has a bottom surface and the bifurcated hub extends from the bottom surface into the pocket.

31. The carrier tape of claim 30, wherein the bifurcated hub presents a center axis substantially normal to the bottom surface and comprises a pair of opposing pedestal portions separated by a gap, each of the pedestal portions having an upper registration surface facing substantially upward.

32. The carrier tape of claim 31, wherein the bifurcated hub further comprises a pair of opposing side portions, each side portion extending upward from a separate one of the pedestal portions.

33. The carrier tape of claim 29, wherein the bifurcated hub further comprises at least one looking protrusion extending radially therefrom.

34. The combination of claim 28, wherein the at least one disk retaining structure comprises a plurality of resilient fingers, the fingers positioned to engage the periphery of the disk.

35. The combination of a plurality of components and a carrier tape for holding the plurality of components, the tape comprising:
a thin, elongate strip of polymer material presenting a longitudinal axis and having a plurality of pockets defined therein, each pocket having a bottom and adapted to receive an individual one of the plurality of components, the plurality of pockets spaced apart and arranged along the longitudinal axis of the strip, the carrier tape further comprising a plurality of closure flaps, each closure flap for closing one of the pockets and being selectively shiftable between an open position wherein the closure flap is substantially coplanar with the strip and a closed position wherein the closure flap is covering the pocket, and wherein the closure flap folds along an axis substantially perpendicular to the longitudinal axis of the strip.

36. The combination of claim 35, wherein the plurality of components are selected from the group consisting of a semiconductor chip, a drive head, and a magnetic disk and wherein the plurality of components are disparate.

* * * * *

UNITED STATES PATENT AND TRADEMARK OFFICE
CERTIFICATE OF CORRECTION

PATENT NO. : 7,219,803 B2 Page 1 of 1
APPLICATION NO. : 11/091697
DATED : May 22, 2007
INVENTOR(S) : Ronald E. Thomas Jr. et al.

It is certified that error appears in the above-identified patent and that said Letters Patent is hereby corrected as shown below:

On Title Page: Item (74) after "Skaar" insert -- & --

Column 5, Line 24, delete "SA", insert -- 5A --

Column 6, Line 25, delete "0", insert -- θ --

Column 6, Line 27, delete "0", insert -- θ --

Column 9, Line 65, delete "carder" insert -- carrier --

Column 10, Line 25, delete "oven", insert -- open --

Column 10, Line 47, delete "oven", insert -- open --

Column 12, Line 31, delete "looking", insert -- locking --

Signed and Sealed this

Fifteenth Day of July, 2008

JON W. DUDAS
*Director of the United States Patent and Trademark Office*